United States Patent [19]
Gil

[11] Patent Number: 5,751,640
[45] Date of Patent: May 12, 1998

[54] SEMICONDUCTOR MEMORY DEVICE AND METHOD THEREOF

[75] Inventor: Gyoung-Seon Gil, Jeonrabook-Do, Rep. of Korea

[73] Assignee: LG Semicon Co., Ltd., Cheongju, Rep. of Korea

[21] Appl. No.: 751,022

[22] Filed: Nov. 15, 1996

[30] Foreign Application Priority Data

Dec. 28, 1995 [KR] Rep. of Korea .................. 62054/1995

[51] Int. Cl.$^6$ .................................................. G11C 11/40
[52] U.S. Cl. ........................ 365/156; 365/154; 257/903; 257/904
[58] Field of Search ................................. 365/156, 154, 365/187, 190; 257/903, 904

[56] References Cited

U.S. PATENT DOCUMENTS

| | | | |
|---|---|---|---|
| 4,852,060 | 7/1989 | Rockett, Jr. .................. | 365/154 |
| 5,070,032 | 12/1991 | Yuan et al. .................. | 437/43 |
| 5,153,852 | 10/1992 | Terrell .......................... | 365/154 |
| 5,220,182 | 6/1993 | Matsuoka et al. ........... | 257/903 |
| 5,386,379 | 1/1995 | Ali-Yamia et al. ........... | 365/156 |
| 5,621,232 | 4/1997 | Ohno ............................ | 257/903 |

*Primary Examiner*—Tan T. Nguyen
*Attorney, Agent, or Firm*—Fleshner & Kim

[57] ABSTRACT

A semiconductor memory device and a fabrication method thereof include formation of surplus gates connected to a cell node of a gate edge region, located at a cell node side of a SRAM access transistor, and to the gate of a driving transistor located at the opposite side thereof. The present invention prevents silicon loss of the substrate caused by the formation of a buried contact in the conventional device, secures an operational stability of the memory cell by controlling differently the current flow of an access transistor in accordance with the condition of the cell node (for example, low level or high level), and facilitates an interconnection in the cell since the gate of a side transistor is used as a substitute for another interconnection (for example, a wiring) when realizing a SRAM. Further, during a reading operation, since the resistance of the n+ source region of the cell node of the access transistor is larger than that of the drain region connected to the bit line, the current driving ability is made lower, and the operational stability is enhanced.

15 Claims, 5 Drawing Sheets

SEMICONDUCTOR MEMORY DEVICE AND METHOD THEREOF

TECHNICAL FIELD

The present invention relates to a memory device and a method thereof, and in particular, to a semiconductor memory device and a method thereof capable of effectively controlling improved control of the current through an access transistor.

BACKGROUND ART

Conventionally, in a SRAM semiconductor memory device, as shown in a circuit diagram of FIG. 1, each cell includes two access transistors M1 and M2 connected to the word line W/L and complementary bit lines B/L and /B/L. Access transistors M1 and M2 and driving transistors M3 and M4 are each composed of an NMOS transistor and load devices M5 and M6 are each composed of a PMOS transistor. In other words, a SRAM cell includes a latch having two inverters (M5 and M3 working as first inverters and M6 and M4 working as second inverters) and the access transistors M1 and M2.

The access transistor M1 is connected to the transistor M5, which is a load device, and the transistor M3, which is a driving transistor. The access transistor M2 is connected to the transistor M6, which is a load device, and the transistor M4, which is a driving transistor. A first cell node (a) of the access transistor M1 is connected to the gate of the driving transistor M4 connected to the access transistor M2. A second cell node (b) of the access transistor M2 is connected to the gate of the driving transistor M3 connected to the access transistor M1. When one cell is selected by the word lines and bit lines and the selected word line is on, a voltage of the cell node becomes high level or low level in accordance with a voltage of the bit line. Hence, writing and reading operations through the access transistor can be performed.

FIGS. 2a through 2d are views showing a fabrication of an access transistor in a SRAM memory cell. In the first step, as shown in FIG. 2a, a field oxide film 3 is formed at an element isolation region on a semiconductor substrate 1, resulting in the definition of a portion for an active region and a portion for an element isolation region, and a gate insulating film 5 is formed at the active region on the substrate.

In the second step, as shown in FIG. 2b, a buried contact 7 is formed by etching the gate insulating film 5 so that a predetermined portion of the substrate surface may be exposed in order to connect the gate of the driving transistor M3 with the second cell node (b). Thereafter, a poly-silicon film 9 is formed on the entire surface of the above-mentioned pattern. In order to dope an impurity into the poly-silicon film 9, an ion implantation is performed using $POCL_3$, which is a high density n-type impurity. During the above process, a predetermined portion of the gate insulating film 5 is eliminated, and then the high density n-type impurity is doped into a predetermined portion of the exposed surface of the substrate, resulting in the formation of an $n^+$ impurity region in the substrate of the buried contact 7.

In the third step, as shown in FIG. 2c, a gate 9' is formed by etching a predetermined portion of the poly-silicon film 9 and an n– lightly doped drain region 11 (hereinafter, called n– LDD region) in the substrate 1 is formed by an ion implantation of a low density n-type impurity, using the gate 9' as a mask. Continuously, the corresponding surface of the substrate 1 is allowed to be exposed by etching the gate insulating film 5 of the bit line side at which the buried contact 7 is not formed. After etching a predetermined thickness of the exposed surface of the substrate in the buried contact 7, a sidewall spacer 13 is formed at the side of the gate 9'.

During the fourth step, as shown in FIG. 2d, an n+ source/drain region is formed by an ion implantation of a high density of n-type impurity into the substrate. The gate 9' and the sidewall spacer 13 is used as a mask during the ion implantation.

An access transistor fabricated by the above-mentioned four step suffers from a loss of silicon in the process of forming the buried contact in order to connect the cell node of the access transistor and the gate of the driving transistor located in the opposite direction therefrom. Thus, a contact resistance of the cell node is increased, resulting in a reduction of the operational stability of the cell. Further, since a current flows in the access transistor irrespective of the voltage of the cell node, and is controlled only by the voltage of the word line, the access transistor connected to a low voltage level of the wordline W/L supplies as great an amount of current as the access transistor can supply, causing the voltage of the access transistor, coupled to the low voltage level, to be raised. The operational stability of the cell is greatly reduced.

DISCLOSURE OF THE INVENTION

The present invention is achieved in part by a memory device, comprising: a) a plurality of wordlines and bitlines; b) a plurality of memory cells, each memory cell being responsive to corresponding wordline and bitline and each cell having i) a latch coupled between a first node for receiving a first predetermined potential and a second node for receiving a second predetermined potential; ii) a first transistor coupled to the latch at a third node, and the corresponding wordline and bitline; iii) a second transistor coupled to the latch at a fourth node, and the corresponding wordline and bitline; and iv) means for controlling a current flow in at least one of the first and second transistors.

The present invention is also achieved in part by a semiconductor device coupled to a node, comprising: a) source and drain regions formed between a channel region on an active area of a substrate defined by a pair of field oxide films; b) a gate insulation film formed over the channel region; c) a gate electrode formed on the gate insulation film; and d) a conductive layer insulatively overlapping the gate electrode and a predetermined portion of the source region, and coupled to an exposed portion of the source region and the node, whereby a current flow is determined based on a potential of the node.

The present invention may also be achieved in part by a method of forming a semiconductor device, comprising: forming a pair of field oxide to define an active region of a transistor; forming source and drain regions between a channel region on the active area of a substrate; forming a gate insulation film over the channel region; forming a gate electrode on the gate insulation film; forming an insulation layer over the active region; etching the insulation layer to expose a first predetermined portion of the source region; and forming a conductive layer over the insulating layer which overlaps the gate electrode and a second predetermined portion of the source region, and coupled to an exposed portion of the second predetermined portion.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

BEST MODE FOR CARRYING OUT THE INVENTION

Figure 1:
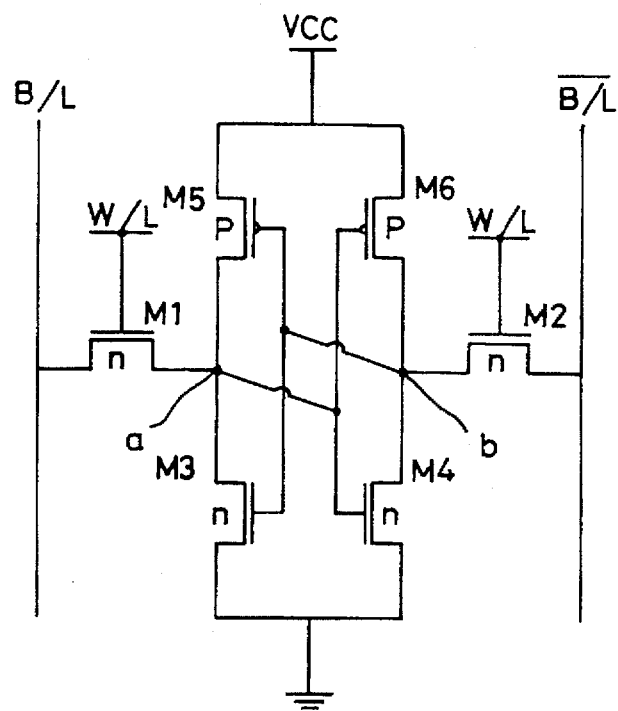
FIG. 1 is a circuit diagram of a conventional SRAM memory cell.
Figure 2A:
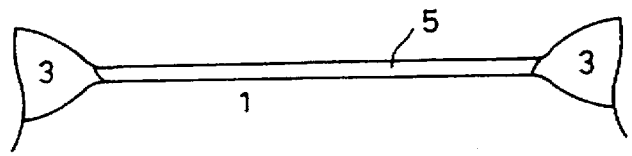
FIGS. 2a through 2d are views showing a fabrication method for an access transistor for a SRAM memory cell illustrated in FIG. 1.
Figure 2B:
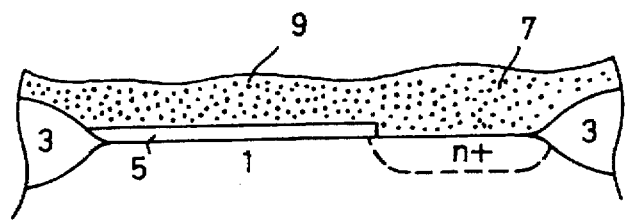
Figure 2C:
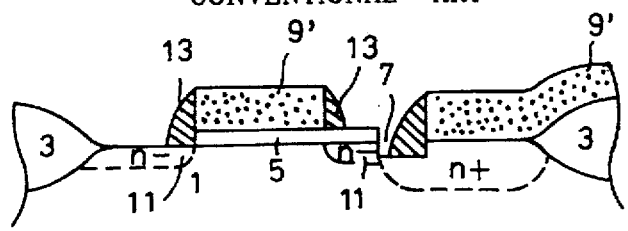
Figure 2D:
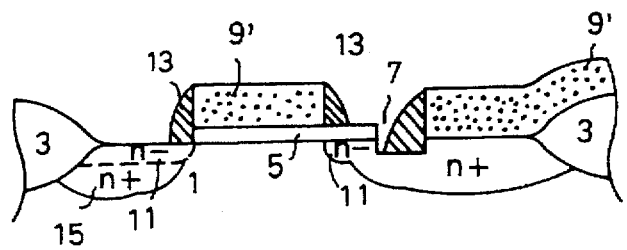
Figure 3:
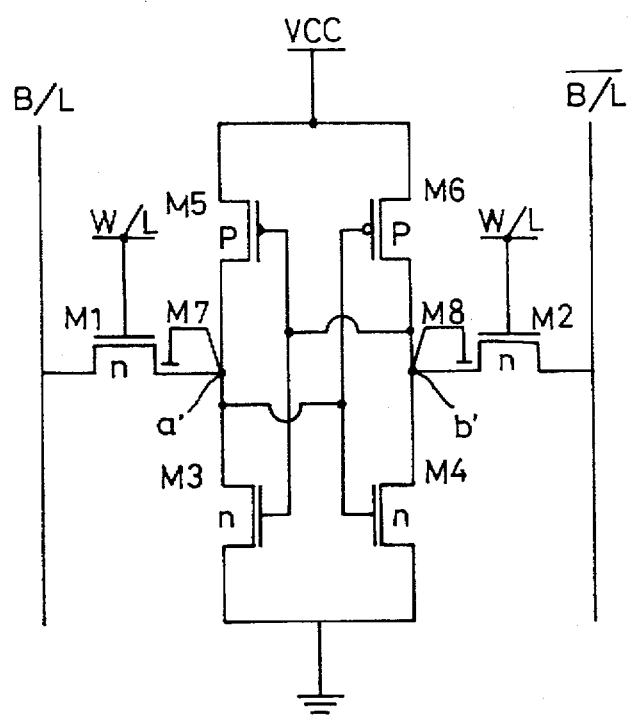
FIG. 3 is a circuit diagram of a SRAM memory cell according to the present invention.

As shown in FIG. 3, the SRAM cell includes a latch which has two inverters (e.g., first inverters M5 and M3, and second inverters M6 and M4), access transistors M1 and M2, and side transistors M7 and M8 having their respective gates connected to the first and the second cell nodes a' and b' of the access transistors M1 and M2. According to the present invention, the current flowing in an access transistor is controlled differently in accordance with the condition of a cell node (for example, high or low level). A side transistor connected to the gate edge region of first and second cell node sides a' and b' of the SRAM cell access transistors M1 and M2 is formed. The memory cell is formed in such a manner that the gates of the side transistors M7 and M8 are connected simultaneously to the cell node and to the gates of the respective driving transistors M3 and M4 located at the opposite sides of the cell therefrom.

The side transistor M7 is connected to the transistor M5, which serves as a load device, and to the driving transistor M3 through the first cell node a'. The side transistor M8 is connected to the transistor M6, which serves as a load device, and to the driving transistor M4 through the second cell node b'. The first cell node a' is linked with the gate of the driving transistor M4 connected to the side transistor M8, and the second cell node b' is linked with the gate of the driving transistor M3 connected to the side transistor M7. The side transistors M7 and M8 operate in a depletion mode, which maintains the transistors M7 and M8 to be turned on.

When the potential at the first and the second cell nodes a' and b' transits to a low level, the gates of the side transistors M7 and M8 are also applied with a low level voltage, and the current flowing in the channels of the side transistors M7 and M8 becomes low. The current flowing in the access transistors M1 and M2 are decreased, and the ratio of Idr/Ida (the current of the driving transistor/the current of the access transistor) is made larger. Consequently, the rate for reaching a low level at the first and second cell nodes a' and b' is accelerated.

When the potential at the first and the second cell nodes a' and b' becomes a high level, the gates of the side transistors M7 and M8 are also applied with a high level voltage. The current flowing in the channels of the side transistors M7 and M8 are sufficiently maintained to be on. Hence, the same current driving capability as that of the conventional access transistors can be obtained, and the potential of the first and the second cell nodes a' and b' becomes a high level.

Figure 4A:
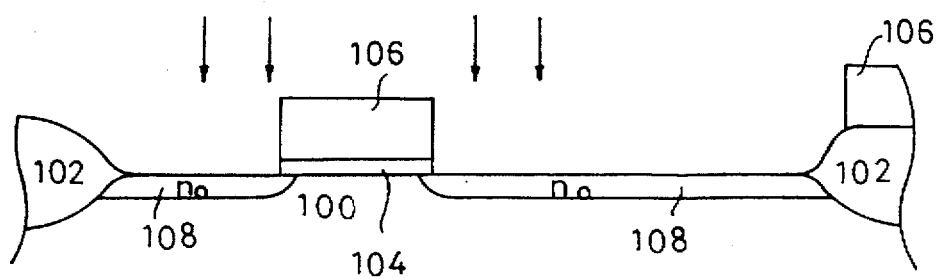
FIGS. 4a through 4d are views showing a fabrication method for an access transistor for a SRAM memory cell illustrated in FIG. 3.

FIGS. 4a through 4d show a fabrication method for an access transistor of a SRAM cell which has the above-mentioned operational characteristics. As shown in FIG. 4a, a field oxide film 102 is formed at an element isolation region on a semiconductor substrate 100 and defines an active region. Thereafter, a gate insulating film 104 is formed. A first poly-silicon film is formed on top of the oxide film 102 and the insulation film 104 and it etched such that predetermined portions of the surface of the substrate 100 and the field oxide film 102 are exposed to form the first gates of the access transistors. An n-type impurity of a low density is ion implanted to control the threshold voltage in order to achieve a depletion mode type operation for a side transistor, which is to be formed at the first gate edge region of the cell node side of the access transistor. As a result, a region $n_0$ is formed in the substrate at each side of the first gate 106. The films 104 and 110 has a thickness range of about 100 to 200 angstroms, and preferably, about 140 angstroms.

Figure 4B:
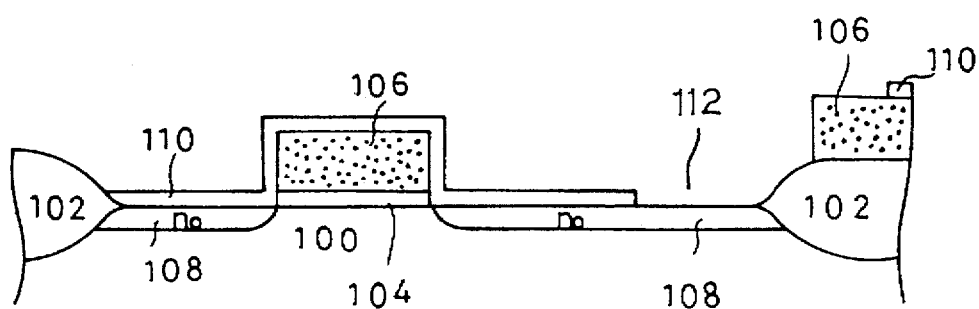

As shown in FIG. 4b, a thin insulating film 110 is formed at the active region on the substrate 100 having the first gate. The insulating film 110 serves as a gate insulating film for a side transistor, which is to be formed afterwards, and insulates the gate of the access transistor from the gate of the side transistor. The insulating film 110 is etched to form a contact hole 112 so that a predetermined portion of the substrate surface of the cell node of the access transistor is exposed, for the purpose of linking the cell node a' or b' and the driving transistor M4 or M3 at the opposite side thereof.

Figure 4C:
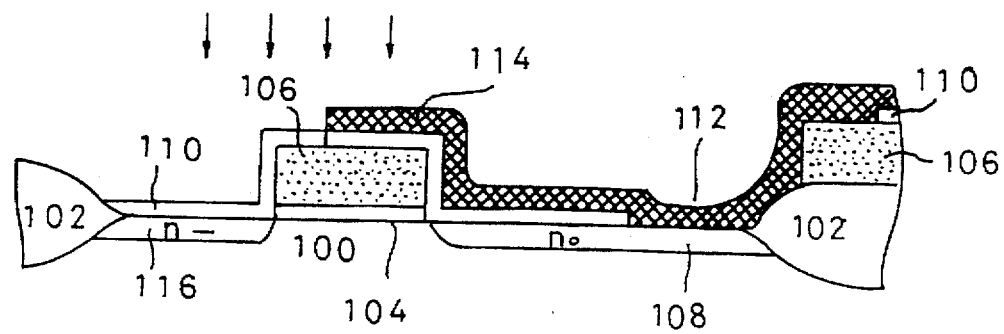

During the third step, as shown in FIG. 4c, a second poly-silicon film is formed on the entire surface of the above-mentioned pattern. A gate of the side transistor is formed by etching the second poly-silicon film 114, and the insulating film 110 at the first gate edge region at the side opposite of the contact hole 112 is exposed. The silicon film 114 has a thickness about 1000 to 2000 angstroms and is formed by CVD. An n-type impurity of a low density is ion-implanted such that an n− LDD region 116 is formed only in the substrate at the bit line side of the access transistor. The second ion implantation process is carried out using an energy low enough such that doping is not at the cell node side of the access transistor.

Figure 4D:
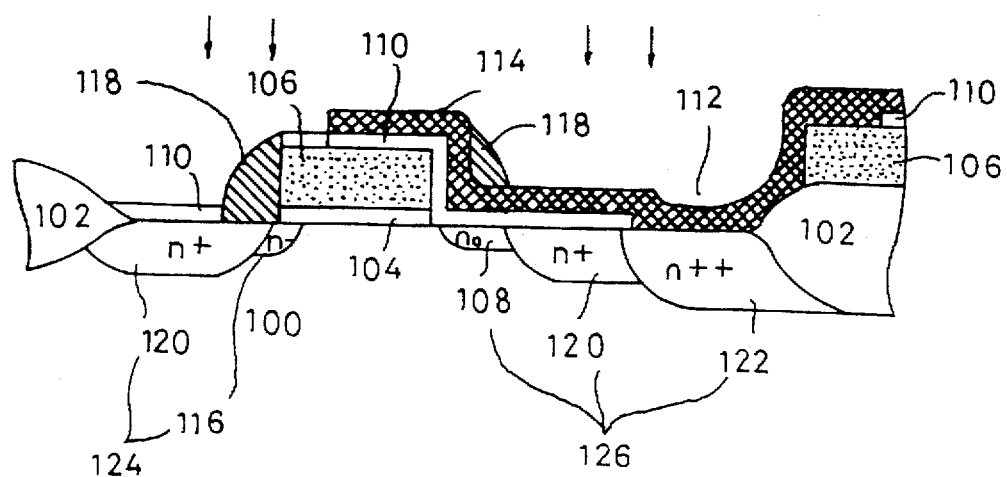

During the fourth step, as shown in FIG. 4d, a sidewall spacer 118 is formed at the sides of the first gate at the bit line side and the second gate of the cell node side. An n-type impurity of a high density is ion implanted into the substrate, using the sidewall spacer as a mask to form the n+ region 120. The n++ region 122 is formed in the substrate on the portion at which the contact hole 112 is formed since the n-type impurity of a high density infiltrates into the substrate in the process of the third ion implantation.

Consequently, in the substrate 100 at the bit line side, the n+ region 120 and the n− LDD region 116 comprise a drain region 124. In the substrate 100 at the cell node side, the $n_0$ region 108, n+ region 120 and n++ region 122 comprise a source drain 126. The doping concentrations of the impurities have relative values of $n_0 < n- < n+ < n++$. For example, $n_0$, n−, n+ and n++ may have concentration levels of $10^{16}$–$10^{17}$/cm$^3$, $10^{17}$–$10^{18}$/cm$^3$, $10^{19}$–$10^{21}$/cm$^3$ and $10^{19}$–$10^{22}$/cm$^3$, respectively.

When performing ion implantation of the high-density n type impurity, an energy level is used whose peak penetration is 200 Å lower than the insulating film 110 at the drain region 124 of the access transistor. Consequently, the n+ region 120 at the source region 126 has a doping concentration lower than the n+ region 120 at the drain region 124. During a reading operation, the n+ resistance of the source region 126 of the cell node of the access transistor is larger than that of the drain region 124 connected to the bit line. Hence, the current driving ability is made lower, and the operational stability is enhanced.

As described in detail above, the semiconductor memory device construction and the fabrication method according to the present invention prevents silicon loss in the substrate caused by the formation of a buried contact. The operational stability of the cell is secured by differently controlling the current of an access transistor, in accordance with the condition of the cell node (for example, low level or high level). An interconnection in the cell is facilitated since the gate of a side transistor is used as a substitute for another interconnection (for example, a wiring) when embodying a SRAM. In the course of a reading operation, since the n+ resistance of the source region 126 of the cell node of the access transistor is larger than that of the drain region 124 connected to the bit line, the current driving ability is made lower, and consequently, the operational stability is enhanced.

The foregoing embodiment is merely exemplary and not to be construed as limiting the present invention. The present scheme can be readily applied to other types of memory devices. One of ordinary skill in the art can use the teachings of the present invention to other devices requiring enhanced operational stability and the advantages set forth above. The description of the present invention is intended to be illustrative, and not limiting the scope of the claims. Many alternatives, modifications and variations will be apparent to those skilled in the art.

I claim:

1. A memory device, comprising:
a) a plurality of wordlines and bitlines;
b) a plurality of memory cells, each memory cell being responsive to corresponding wordline and bitline and each cell having
   i) a latch coupled between a first node for receiving a first predetermined potential and a second node for receiving a second predetermined potential;
   ii) a first transistor coupled to said latch at a third node, and said corresponding wordline and bitline;
   iii) a second transistor coupled to said latch at a fourth node, and said corresponding wordline and bitline; and
   iv) means for controlling a current flow in at least one of said first and second transistors.

2. The memory device of claim 1, wherein said controlling means comprises:
a third transistor coupled to said third node; and
a fourth transistor coupled to said fourth node.

3. The memory device of claim 1, wherein each of said first and second transistors comprises:
a) source and drain regions formed between a channel region in a substrate, said drain region being coupled to said corresponding bitline and said source being coupled to said third node;
b) a gate insulation film formed over said channel region; and
c) a gate electrode formed on said gate insulation film, wherein said controlling means comprises
d) a conductive layer insulatively overlapping said gate electrode and a predetermined portion of said source region, and coupled to an exposed portion of said source region.

4. The memory device of claim 3, wherein said source region comprises:
a first region having a first predetermined concentration of n− which is partially overlapped by said gate electrode; and
a second region having a second predetermined concentration of n+ coupled to said corresponding bitline.

5. The memory device of claim 4, wherein said second predetermined concentration is larger than said first predetermined concentration.

6. The memory device of claim 3, wherein said drain region comprises:
a first region having a first predetermined concentration of $n_o$ formed adjacent to said gate electrode;
a second region having a second predetermined concentration of n+ adjacent to said first region; and
a third region having a third predetermined concentration of n++ adjacent to said second region.

7. The memory device of claim 6, wherein said second predetermined concentration is greater than said first predetermined concentration, but less than said third predetermined concentration.

8. The memory device of claim 6, wherein said conductive layer insulatively overlaps the first and second region and contacts the third region.

9. The memory device of claim 1, wherein said latch comprises:
a first inverter having a first load transistor and a first drive transistor with drains commonly coupled at said third node, and gates commonly coupled to each other, wherein said gates of said first load and drive transistors are coupled said fourth node; and
a second inverter having a second load transistor and a second drive transistor with drains commonly coupled at said fourth node and gates commonly coupled to each other, wherein said gates of said second load and drive transistors are coupled to said third node.

10. A semiconductor device coupled to a node, comprising:
a) source and drain regions formed between a channel region on an active area of a substrate defined by a pair of field oxide films;
b) a gate insulation film formed over said channel region;
c) a gate electrode formed on said gate insulation film; and
d) a conductive layer insulatively overlapping said gate electrode and a predetermined portion of said source region, and coupled to an exposed portion of said source region and the node, whereby a current flow is determined based on a potential of the node.

11. The semiconductor device of claim 10, wherein said source region comprises:
a first region having a first predetermined concentration of n− which is partially overlapped by said gate electrode; and
a second region having a second predetermined concentration of n+ coupled to said corresponding bitline.

12. The semiconductor device of claim 11, wherein said second predetermined concentration is larger than said first predetermined concentration.

13. The semiconductor device of claim 10, wherein said drain region comprises:
- a first region having a first predetermined concentration of $n_o$ formed adjacent to said gate electrode;
- a second region having a second predetermined concentration of n+ adjacent to said first region; and
- a third region having a third predetermined concentration of n++ adjacent to said second region.

14. The semiconductor device of claim 13, wherein said second predetermined concentration is greater than said first predetermined concentration, but less than said third predetermined concentration.

15. The semiconductor device of claim 13, wherein said conductive layer insulatively overlaps the first and second region and contacts the third region.

* * * * *